United States Patent [19]

Maitre et al.

[11] 4,313,194

[45] Jan. 26, 1982

[54] TRANSMISSION SYSTEM OF FREQUENCY DIVISION MULTIPLEX SIGNALS ON DIGITAL LINKS

[76] Inventors: Xavier C. Maitre, Route de Pennker le Boung; Alain M. Thomas, Cosmos, Bat. E, both of Lannion, France, 22300

[21] Appl. No.: 107,563

[22] Filed: Dec. 27, 1979

[30] Foreign Application Priority Data

Dec. 28, 1978 [FR] France .................. 78 36758

[51] Int. Cl.³ .................................. H04H 1/02
[52] U.S. Cl. ........................... 370/69; 375/17; 375/25; 370/118
[58] Field of Search ............ 370/7, 69, 70, 118; 371/2, 52; 375/17, 25, 26, 30, 31, 32; 179/15.55 R; 340/347 DD; 333/14; 358/13, 260, 133, 138

[56] References Cited

U.S. PATENT DOCUMENTS

| | | | |
|---|---|---|---|
| 3,735,264 | 5/1973 | Mauduech | 375/26 |
| 4,013,842 | 3/1977 | Kao et al. | 370/70 |
| 4,131,766 | 12/1978 | Narasimha | 370/70 |
| 4,193,096 | 3/1980 | Stoffel | 358/138 |

Primary Examiner—Benedict V. Safourek

[57] ABSTRACT

Transmission system of frequency division multiplex signals on a digital link. At the transmitting end of the digital line, the frequency division multiplex signals are sampled and coded into n-bit sample words. These sample words are transcoded into p-bit on-line words with p smaller than n through a transcoding procedure which makes a plurality k of successive levels of the n-bit code correspond to one and the same level of the p-bit code. The number k is selected depending on the maximal level reached by a sample word in a block of successive sample words. The number k is transmitted to the receiving end of the digital link by a control word for reverse transcoding of the on-line p-bit words into reconstituted n-bit sample words.

2 Claims, 7 Drawing Figures

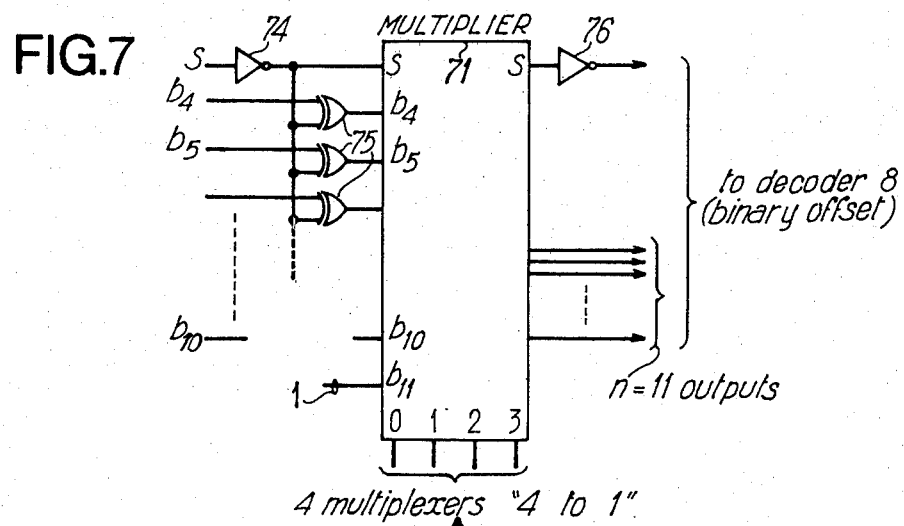
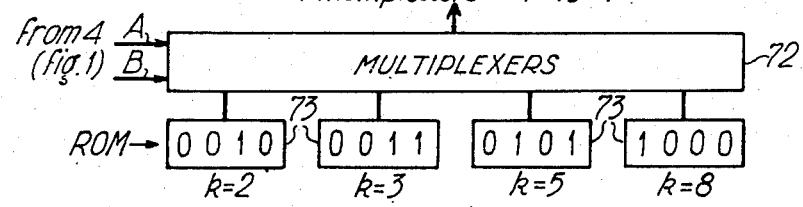
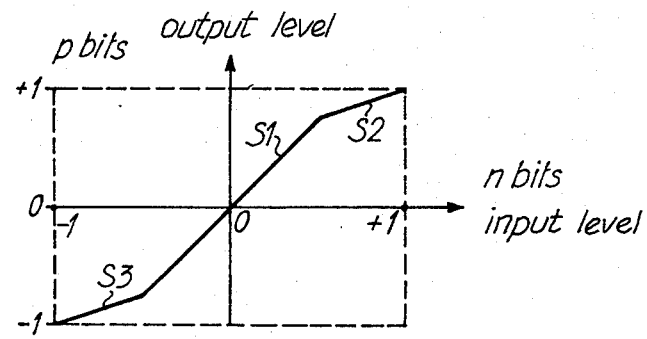
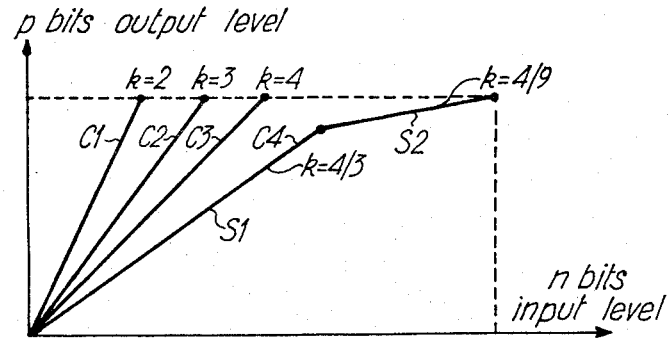

TRANSMISSION SYSTEM OF FREQUENCY DIVISION MULTIPLEX SIGNALS ON DIGITAL LINKS

BACKGROUND OF THE INVENTION

1. Field of the Invention

The invention concerns transmission systems on digital links of frequency division multiplex analog telephone signals (FDM signals), that is analog signals obtained by modulation of carriers having regularly spaced apart frequency using telephone signals whose frequency bandwidth has been limited.

2. Description of the Prior Art

The transmission of FDM signals on a digital link naturally implies their digital coding at the transmission channel input and their decoding at the reception channel output. It has already been proposed (see for example "IEEE TRANSACTIONS ON COMMUNICATIONS", Vol. COM. 25- No. 1, February 1977, Andrews et al., pages 264–271) to transmit FDM telephone signals by pulse code modulation (PCM) non linear coding. It will be shown further on that this coding method cannot provide maximum loading of the digital channel when the FDM phone channels are organized into groups each consisting of a large number of channels.

Recommendations of the CCITT ("Comité Consultatif International Télégraphique et Téléphonique") are relative to FDM and particularly those FDM signals whose carriers are spaced apart by 4 kHz and modulated in SSB (single sideband) mode by phone signals which have been limited to the 300–3400 Hz band. They recommend regrouping the above-mentioned channels into a whole organized in hierarchical levels into the following groups:

| group: | 12 channels in the 60-108 kHz band, |
|---|---|
| supergroup: | 60 channels in the 312-552 kHz band, |
| master group: | 300 channels in the 812-2044 kHz band, |
| super master group: | 900 channels in the 8516-12388 kHz band. |

To justify the coding procedure choice adopted for the invention's system, let us briefly consider the application of the various procedures which can be used for coding a SMG (super master group). As we have seen, a SMG is composed of 900 phone channels in a bandwidth of 3872 kHz (limit frequencies 8516 and 12 388 kHz). Once the SMG is brought into the appropriate band, its sampling frequency should then be more than double the band width, that is 7744 kHz. Taking into consideration the frequency margins to be planned for the filtering before coding and after decoding, this sampling frequency should be from 8 to 8.5 MHz. We are going to calculate how many SMGs may be transmitted using the various procedures within a hierarchical digital rate of 140 Mbit/s (exactly 139.264 kbit/s), originally planned for the transmission of 1920 digital channels at 64 kbit/s.

In linear coding, it can be demonstrated that the necessity of limiting the white noise of theoretical quantization brought to the channel to an acceptable level, implies assigning 10 bits to each sample. The digital rate necessary is 80 to 85 Mbit/s while the available rate is 140 Mbits/s. So, only one SMG can be transmitted. To better utilize the remaining digital rate, we can consider assigning it to other transmission purposes but this approach complicates the operation.

Non-linear coding will not be superior to linear coding unless it makes it possible to transmit two SMGs in the available digital rate capacity. So, a compression procedure should be considered with a non-linear characteristic to bring the number of bits per sample to 8. The calculation demonstrates that for the conventional load Cc, the theoretical quantization noise per channel is 800 pWop and consequently remains very considerable.

Coding with a non-integer number of bits, in the case of the SMGs consists of coding the signal into 9-bit sample words according to a non-linear characteristic (for example, a 5 segment characteristic) but only transmitting 8 bits p/n times and transmitting the 9 bits (n-p)/n times. In this way, we obtain an average number of bits per sample of $(9-p/n)$ bits which is no longer an integer. The calculation shows that the improvement of the signal to noise ratio increases as p approaches n, but that it remains insufficient (2 dB only) for realistic values of $(n-p)/n$, that is for values which remain less than $\frac{1}{2}$.

In fact, in the case under consideration, adaptative block coding is the best approach. Computer simulation demonstrates, for a constant throughput rate, that that quantization noise is considerably reduced (for example, by 2.5 dB) in comparison with the quantization noise brought about by non-linear coding with non-integer number of bits. At low levels, this reduction reaches 4 dB. It is to be noticed that adaptative block coding consists of forming sample blocks (that is, series having a constant number of samples), selecting a coding characteristic for each of these blocks from among a determined number of characteristics, and transmitting to the decoder, together with each block of samples, a signal indicating the characteristic chosen for the block to which the samples belong. When transmitting FDM signals, it is advantageous, for the coding of each block, to select the characteristic which provides the minimum quantization noise. The number of characteristics available is limited by the number of bits which can be transmitted by the remaining throughout capacity, that is, the capacity which has not been used by the transmission of sample bits and sync. bits (frame, multiframe, etc-). For blocks of m samples and a number $2^\alpha$ of characteristics, the throughput rate required for transmitting the signal identifying the characteristic is evidently $\alpha/m$ bits per sample.

The invention's system is not only applicable to the transmission of two CCITT super master groups on a 140 Mbit/s digital channel. It also makes it possible, for example, to transmit on the said 140 Mbit/s channel, two sets of 15 and even 16 supergroups. It also makes it possible to transmit a group of 600 channels on a digital link of 44 736 kbit/s under better conditions than in the system described in the above-mentioned reference of Andrews et al.

SUMMARY OF THE INVENTION

According to the invention, a system for transmitting frequency division multiplex analog signals on a digital link comprises:

one analog signal sampler;

one linear coder converting each sample delivered by said sampler into a parallel digital word of n bits;

one characteristic selection circuit which generates $\alpha$-bit words for controlling the transcoding characteristic of a variable characteristic transcoder from the values of the total level of sample blocks formed by a sequence of m sample words;

one variable characteristic transcoder formed by read-only memory means having words of at most p bits stored therein at addresses thereof formed of two parts one of which depends on the linear coder and the other of which depends on the characteristic selection circuit, multiplexer means receiving each word of at least p bits delivered by the said variable characteristic transcoder plus control words of $\alpha$ bits assigned to the corresponding block and delivering them to the digital link in the form of a multiplexed digital signal also including sync. bits;

a series-parallel converter receiving the multiplexed digital signal conveyed by the digital link and converting it into a series of pairs of parallel words, each pair consisting of a sample parallel word of p bits and a characteristic control word of $\alpha$ bits;

a second variable characteristic transducer receiving the abovementioned word pairs and converting the parallel sample words of p bits into parallel sample words of at least n bits; and a linear decoder restoring the frequency division multiplex analog signals using the series of parallel sample words of at least n bits delivered by the second variable characteristic transcoder.

BRIEF DESCRIPTION OF THE DRAWINGS

The invention will now be disclosed in detail in relation with the accompanying drawings, in which:

FIG. 3 is an example of a characteristic curve for non-linear transcoding;

FIG. 4 is an example of characteristic curves for linear and non-linear transcoding;

FIG. 7 is a block diagram of a second variable characteristic transcoder which is a part in the block diagram of FIG. 1.

DESCRIPTION OF THE PREFERRED EMBODIMENT

Figure 1:
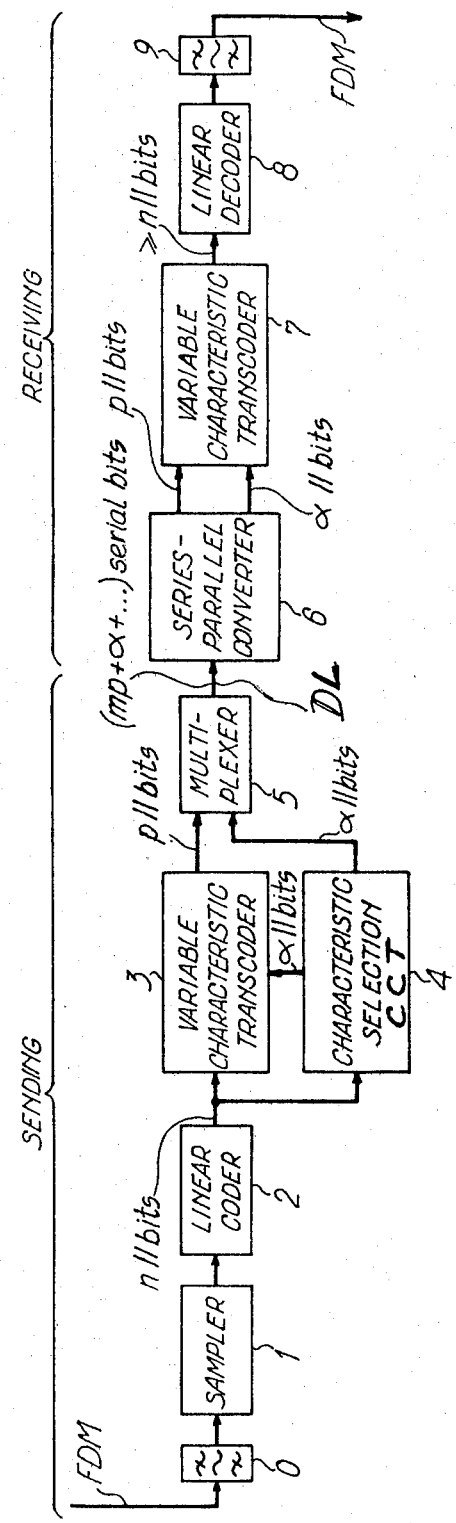
FIG. 1 is a block diagram of a FDM transmission system according to the invention.

Let us first of all consider FIG. 1. In accordance with the invention summary, the invention system for the transmission of FDM signals on a digital link (DL) comprises:

(1) A transmitting device consisting of:
one passband filter 0 followed by a sampler 1;
one linear coder 2 converting each sample delivered by the sampler 1 into a parallel word of n bits;
one characteristics selection circuit 4, generating parallel control words of $\alpha$ bits based upon the overall level of blocks of m samples;
one variable characteristic transcoder 3 using ROM memories, having first address inputs connected to the output of coder 2 and second address inputs connected to the control output of circuit 4 and delivering parallel words of at most p bits stored at addresses defined by these first and second address inputs;

one multiplexer 5 receiving each word of at most p bits delivered by transcoder 3 and the corresponding $\alpha$ bit word delivered by circuit 4, and applying them to the digital link (DL) in the form of a serial word also comprising sync. bits.

(2) A reception device consisting of:
one serial-parallel converter 6 receiving the signals delivered by the digital link (DL) and converting them into a series of word pairs, each word pair consisting of a sample parallel word of p bits and a characteristic control parallel word of $\alpha$ bits;

one variable characteristic transcoder 7, receiving each word pair delivered by converter 6 and converting the parallel word of p bits into a parallel word of at least n bits;

one linear decoder 8 followed by a passband filter 9 to restore the FDM signals using words delivered by transcoder 7.

In all that follows, and unless otherwise indicated:

each of the words of n bits delivered by linear coder 2 to the code transcoder 3 consists of one sign bit plus (n−1) bits of absolute value;

each of the words of p bits delivered by variable characteristic transcoder 3 to multiplexer 5 consists of one sign bit plus (p−1)bits of absolute value, but characteristic selection circuit 4 adds to this word the characteristic control word of $\alpha$ bits assigned to the corresponding block, $\alpha$ evidently being limited by the available digital rate;

variable characteristic transcoder 7, therefore, receives, via series-to-parallel converter 6 from the digital link (DL), word pairs each of which includes a sample word of p bits (one sign bit, (p−1) bits of absolute value) plus one characteristic control word of $\alpha$ bits, and restores the sample words of n or (n+1) bits, according to the case which will be considered further on including, in any event, one sign bit.

We shall see that, according to the case, variable characteristic transducers 3 and 7 can be either linear transcoders (that is, with their characteristics linear), or they may be transcoders with at least one non-linear characteristic.

Firs of all, we shall consider the case of linear transcoding.

A n-bit code with a sign bit has $2^{n-1}$ levels and a p-bit code with a sign bit has $2^{p-1}$ levels Let us assume that n>p. The number of then-bit code levels is larger than the number of the p-bit code levels and it is possible to make several n-bit code consecutive levels correspond to one and the same p-bit code level.

Let k be the number of the n-bit code levels which are grouped into one and the same level of the p-bit code. The maximal level which it is possible to reach in the grouped n-bit code is $$C_k = k2^{p-1} - 1 \qquad (1)$$

This level $C_k$ corresponds to the analog level $$C_k \times V_{max} \frac{1}{2^{n-1}} = \frac{(k \, 2^{p-1} - 1) \, V_{max}}{2^n - 1} \qquad (2)$$

where $V_{max}$ is the peak voltage of coder 2.

Figure 2:
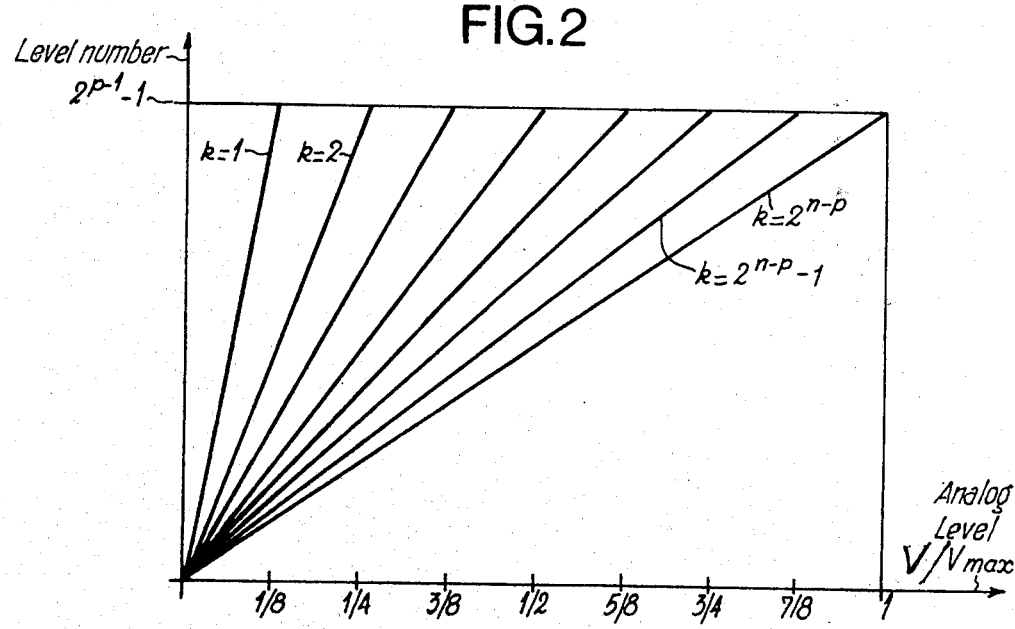
FIG. 2 is an example of characteristic curves of linear transcoding.

The values which it is possible to assign to k are those of the integer numbers from 1 to $2^{n-p}$ (delimiters included). This fact is illustrated by FIG. 2 which represents a correspondance diagram whose ordinates give the number of levels available at the output from variable characteristic transducer 3 and whose abscissas give the corresponding analog level (expressed in $V_{max}$). The family of straight lines in the diagram of FIG. 2 represents the various characteristics of transcoding, and the slopes of these lines are respectively proportional to the various values of k.

If we call /x/ a level in absolute value belonging to the n-bit code, we see, by setting up the division:

$$/x/ = q.k + r \text{ with } 0 \leq r < k \tag{3}$$

that /x/ can be expressed into the p bit code by a number q ($0 \leq q < 2^{p-1}$) because a bit is reserved for the sign with a precision improving as r becomes smaller. The number q, whole part of the quotient of the division of /x/ by k, is also the product of /x/, multiplicand, by 1/k, multiplier. The transcriptions in binary form of /x/ and 1/k can be respectively expressed by the following two series:

$$|x| = \sum_{i=0}^{n-2} a_i 2^i \tag{4}$$

$$1/k = \sum_{j=0}^{+\infty} \alpha_j 2^{-j} \tag{5}$$

which shows that the linear transcoding of /x/ expressed in the n bit code, into the p bit code, can be accomplished using a digital multiplier which makes it possible to calculate the product of the developments of these two series. The value of the $a_i$ coefficients are imposed by the value of /x/. The values of the $\alpha_j$ coefficients depend upon the k characteristic selected. If k is a power of 2 (for example, $2^\beta$), the corresponding series has a finite number of terms; it has an infinite number of terms in the opposite case, but we can keep sufficient precision in transcoding by limiting the number of bits to an appropriate value. Actually, the series expressing 1/k can be transcribed in the following form:

$$(1/k)' = \sum_{j=0}^{\gamma} \alpha_j 2^{-j} + \epsilon 2^{-\gamma} \tag{6}$$

in which
 (1/k)' is the close value of 1/k in excess or in lack,
 $\delta$ is the number of bits less 1,
 $\epsilon$ is equal to 0 or 1.

We can then choose values of $\delta$ and $\epsilon$ so that the calculations of (1/k) and (1/k)' give the same values for the whole part q.

In linear adaptative transcoding, k is a quantitized variable whose maximum value we call $k_{max}$ and whose minimum value call $k_{min}$. If:

$$2^\delta - 1 < k_{min} \leq 2^\delta \tag{7}$$

the number of bits necessary for expressing (1/k)' is then equal to:

$$\delta_{max} + 1 - \delta$$

$\delta_{max}$ being the maximum value of $\delta$ for the various values of k.

Till this point, we have considered the case of a linear adaptative block transcoder at coding and consequently at decoding. It may turn out to be advantageous to assign a non-linear pattern to at least one of these characteristics. The invention makes it possible to establish transcoders (for coding and decoding) which use read-only memories (ROM) and which can be assigned characteristics which have all the desirable linear or non-linear forms of patterns.

FIG. 3 is a diagram which illustrates the simplest example of a non-linear transcoding characteristic. This is a rectilinear 3-segment symmetrical characteristic relative to the transcoding of n-bit words into p-bit words or reciprocally. The axis of the abscissas is relative to the n-bit code, and the axis of the ordinates is relative to the p-bit code. The coordinates are standardized, that is, the maximum values (load capacities) carried on the two axes, are equal to 1. The characteristic is made up of a segment S1 which goes through origin 0, symmetrical to it, and whose extremity in the first quadrant is linked to the point of coordinates (+1, +1) by a segment S2 and whose extremity in the third quadrant is linked to the point of coordinates (−1, −1) by a segment S3 which is symmetrical to segment S2 in relation to origin 0.

Generally speaking, whatever the number of segments, one has only to consider the first quadrant of the diagram because of the symmetry. Since p<n, the slopes of the various segments, in standardized coordinates, have the following form:

$$2^{n-p}/k \text{ where k is an integer}$$

The data relative to the slopes of these segments are not completely satisfactory. Also, it is necessary to define the connections near the intersections of the segments.

For example, to code two SMGs in a digital channel at 140 Mbit/s (n=11, p=8), we can advantageously use the family of characteristics of FIG. 4. This family has three rectilinear characteristics C1, C2 and C3 with respective slopes of 4, 8/3 and 2 (respectively corresponding to k=2, 3 and 4) and a non-linear characteristic C4 with three linear segments, whose segment S1 has a slope 4/3 (that is, k=6), and segments S2 and S3 (the latter being not shown), with a slope of 4/9 (that is, k=18). The calculation demonstrates that the theoretical connecting point for segments S1 and S2 has an abscissas of ⅔ and an ordinate of 5/6. But the correspondance is to be made between code words of n=11 bits and code words of p=8 bits. The code words of n=11 bits are formed in groups of six words in segment S1 and groups of eighteen words in segments S2 and S3. For example, to define the connections, we can begin at the ends of the half diagram of the quadrant under consideration (that is, the origin for segment S1 and the load capacity for segment S2), and define the connection of blocks of from 6 to 18 words, in n-bit code to provide a quasi-continuity. At decoding, the use of a transcoder with (n+1)=12 output bits will make it possible to provide the correspondance of each block to its mean level whether there is an even or odd number of words in the block.

Figure 5:
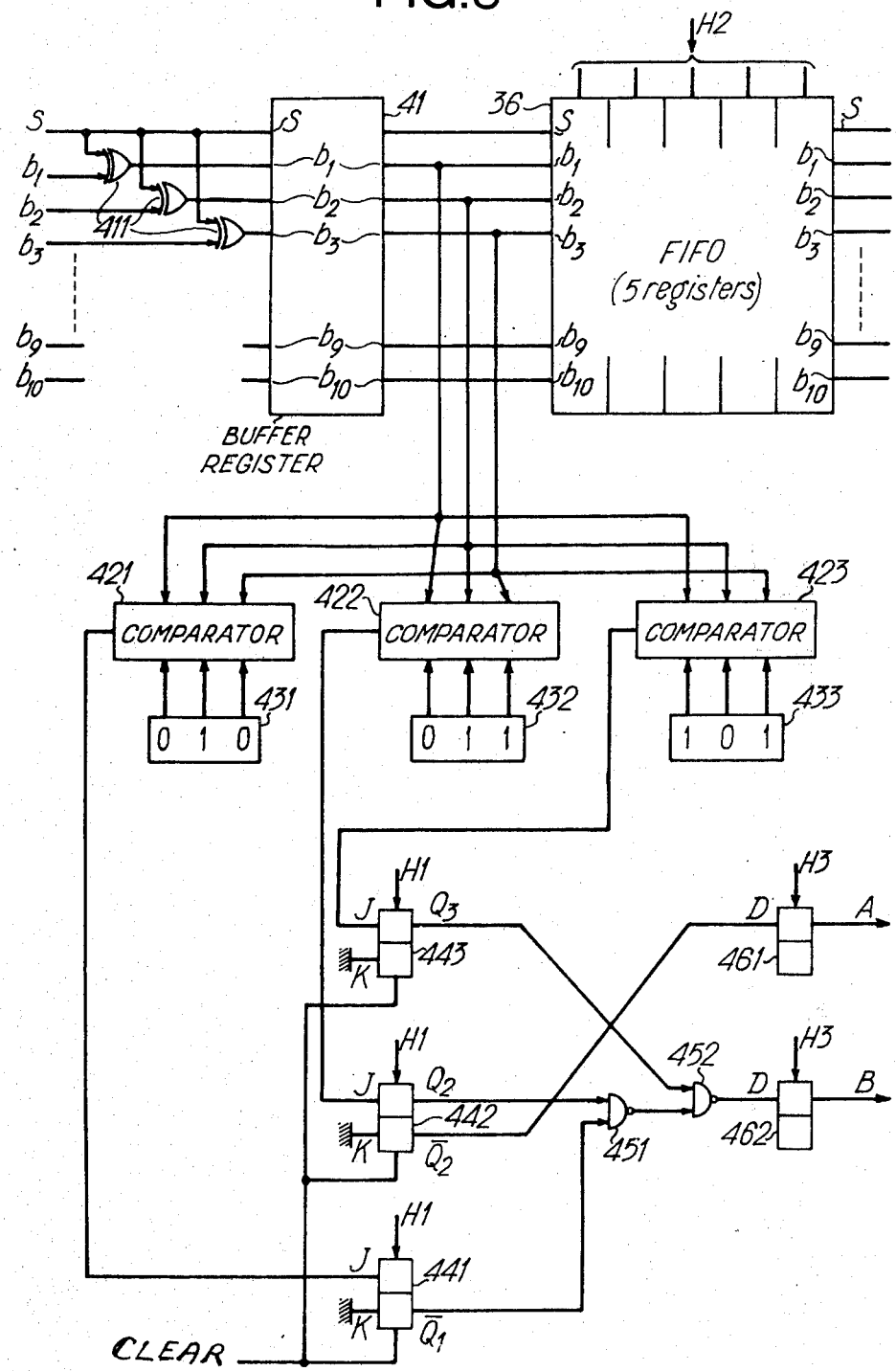
FIG. 5 is a bloc diagram of a characteristic selection circuit which is a part of the block diagram in FIG. 1.

Now let us consider FIG. 5. This figure is an embodiment of a characteristic selection circuit 4 (FIG. 1), which generates and delivers $\alpha = 2$ characteristic selection bits A and B to be applied to variable characteristic transcoder 3 and to multiplexer 5 from the values of the sample words of a sample word block comprising m successive sample words (m=5 in the circuit in FIG. 5).

From here on, it is specified that the sync. inputs referenced H1 and H2 receive clock pulses at sampling frequency $f_e$ of sampler 1 on FIG. 1, and that the sync. inputs referenced H3 as well as the reset to zero inputs referenced CLEAR receive clock pulses at frequency ($f_e/m$), here ($f_e/5$).

Figure 6:
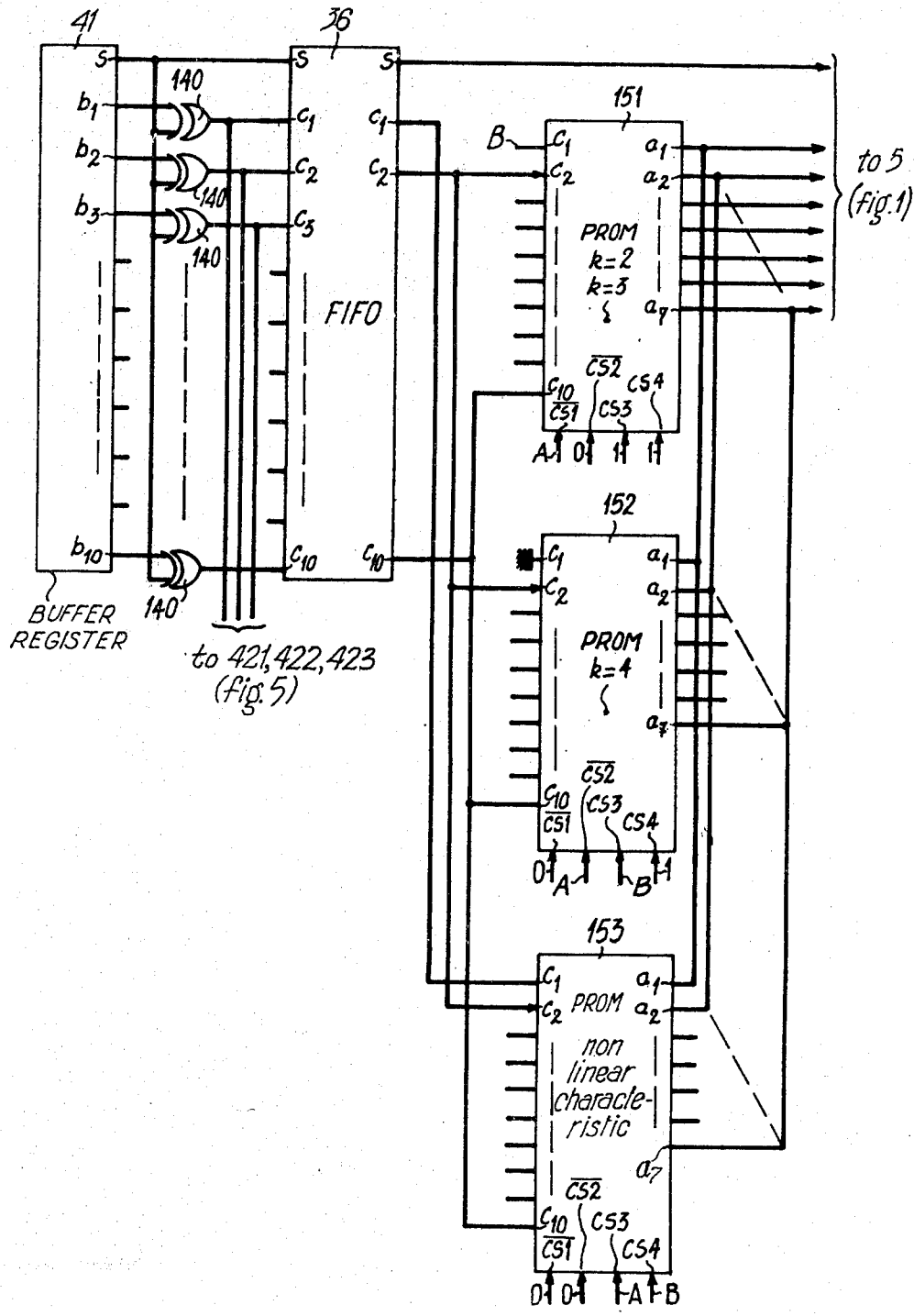
FIG. 6 is a block diagram of a first variable characteristic transcoder which is a part in the block diagram of FIG. 1.

The characteristic selection circuit described here consists of:

one buffer register 41 of 11 bits whose sign input S is directly connected to output S of linear coder 2 (FIG. 1), whose inputs $b_1, b_2, \ldots b_{10}$ are connected to the corresponding outputs of this coder via "exclusive OR" gates 411 each having one input connected to the said outputs, and the other input to output S, and whose outputs are respectively connected to the inputs of a FIFO stack 36 that we shall see further in FIG. 6:

three comparators 421, 422 and 423 each comparing the number formed by the three high weight bits $b_1, b_2$ and $b_3$ delivered by register 41 to reference values respectively stored in memory registers 431, 432 and 433, and each delivering an output signal when the said number is less than the corresponding reference value;

three flip-flops JK 441, 442 and 443 whose J inputs are respectively connected to the outputs of comparators 421, 422 and 423, their K inputs being connected to the ground;

a NAND gate 451 one of whose inputs is connected to output $\overline{Q}_1$ of flip-flop 441, and whose other input is connected to output $Q_2$ of flip-flop 442;

a NAND gate 452 one of whose inputs is connected to the output of gate 451 and whose other input is connected to output $Q_3$ of flip-flop 443;

a first D flipflop 461 whose input is connected to output $\overline{Q}_2$ of flip-flop JK 442 and whose output delivers bit A to transcoder 3 (FIG. 1) and to multiplexer 5;

finally, a second flip-flop D 462 whose input is connected to the output of gate 452 and whose output delivers bit B.

Let us assume that the values of the thresholds or reference values stored in any of registers 431, 432 or 433 can be expressed by $k2^\beta$ with k being odd and comprised between the limits of a n-bit code with a sign bit. Accordingly $$1 \leq k2^\beta \leq 2^{n-1} - 1 \quad (10)$$

and assuming n=11

$$1 \leq k2^\beta \leq 2^{10} - 1$$

Therefore k is expressed with $(n-\beta-1)$ bits.

The modulus of each sample can be expressed by $$/x/ = y \times 2^\beta + z$$

with $$0 \leq z \leq 2^\beta - 1 \quad (11)$$

If $y < k$ $$/x/ < k2^\beta \quad (12)$$

and if $y \geq k$ $$/x/ \geq k2^\beta \quad (13)$$

$/x/$ is expressed in $(n-1)$ bits; y is expressed in the $(n-\beta-1)$ bits of higher weight of $/x/$ and z is expressed in the $\beta$ bits of lower weight of $/x/$. Thus it is sufficient to compare the $(n-\beta-1)$ bits of higher weight to the binary code representing k which has also $(n-\beta-1)$ bits for deciding whether or not to adopt the corresponding characteristic.

Remember that, in the examples described:

n=11; p=8; k=2, 3, 5 or 8.

Because the load capacity of linear coder 3 (FIG. 1) is equal to the load capacity corresponding to the maximum value k=8, the comparison with the threshold corresponding to k=8 is useless. This is why the circuit of FIG. 5 only has three comparators 421, 422 and 423. Their respective comparison thresholds are:

| | | |
|---|---|---|
| for 421, $k_1 = 2.2^{p-1} = 2^p$ | for which $\beta = p$ | $= 8$ |
| for 422, $k_2 = 3.2^{p-1}$ | for which $\beta = p - 1$ | $= 7$ |
| for 423, $k_3 = 5.2^{p-1}$ | for which $\beta = p - 1$ | $= 7$ |

The number of high weight bits to be compared here are $n - \beta - 1 = 10 - \beta$, so we select the minimum value $\beta = 7$ in the three comparison cases. The comparisons are all on three bits, that is the high weight bits $b_1, b_2$ and $b_3$, and the values stored in the three registers are:

| | | |
|---|---|---|
| for 431: | 010 | (k = 2), |
| for 432: | 011 | (k = 3), |
| for 433: | 101 | (k = 5). |

These three comparisons make it possible to choose between four characteristics ($2^\alpha = 2^2 = 4$); so, one has only to deliver two bits A and B to transcoder 3 and to multiplexer 5 (FIG. 1).

By the calculation, we can show that, in the case under consideration, the natural correspondance between the following values of k and the values of the bits A and B is:

| | | |
|---|---|---|
| k = 2 | A = 0 | C = 0 |
| k = 3 | A = 0 | B = 1 |
| k = 5 | A = 1 | B = 0 |
| k = 8 | A = 1 | B = 1 | which leads to a minimum degradation in case of transmission errors. JK and D flipflops in the diagram on FIG. 5 make it possible to obtain this correspondance.

In effect, the three JK flipflops 441, 442 and 443 receive the sync. pulses at frequency $f_3/m$ via their $H_1$ inputs, and the reset to zero pulses at the same frequency via their CLEAR inputs. If, in the interval between reset to zero pulses, the signal delivered at input J of one of these flip-flops remains equal to zero (absence of signal from corresponding comparator 421, 422 or 423), the Q output of the said flip-flop remains in its initial state, for example, state 0. If at least one signal is delivered to the said J input during the said interval, the Q output then goes to the opposite state, for example state 1, while the $\overline{Q}$ output which was in state 1, goes to state 0.

If we call:

<k2: the logic signal delivered by comparator 421;
<k3: the logic signal delivered by comparator 422;
<k5: the logic signal delivered by comparator 423;
$\overline{Q1}$: the $\overline{Q}$ output of flip-flop JK 441;
Q2: the Q output of flop-flop JK 442;
$\overline{Q2}$: the $\overline{Q}$ output of that same flip-flop;
Q3: the Q output of flip-flop JK 443.

We can establish, according to the diagram of FIG. 5, the following truth table (451 and 452 respectively designating the signals delivered by gates 451 and 452):

| <k2 | <k3 | <k5 | $\overline{Q1}$ | Q2 | $\overline{Q2}$ | Q3 | 451 | 452 | A | B |
|---|---|---|---|---|---|---|---|---|---|---|
| 1 | 1 | 1 | 0 | 1 | 0 | 1 | 1 | 0 | 0 | 0 |
| 0 | 1 | 1 | 1 | 1 | 0 | 1 | 0 | 1 | 0 | 1 |
| 0 | 0 | 1 | 1 | 0 | 1 | 1 | 1 | 0 | 1 | 0 |
| 0 | 0 | 0 | 1 | 0 | 1 | 0 | 1 | 1 | 1 | 1 |

In conclusion:

if binary number $b_1$, $b_2$, $b_3$ is less than 010 for all the samples of the block, binary number AB takes the value 00 corresponding to characteristic k=2;

if $b_1$, $b_2$, $b_3$ is at least equal to 010 and less than 011 for a block sample, binary number AB takes the value 01 corresponding to characteristic k=3;

if $b_1$, $b_2$, $b_3$ is at least equal to 011 and less than 101 for at least one block sample, AB takes value 10 corresponding to k=5;

if $b_1$, $b_2$, $b_3$ is at least equal to 101 for a block sample, AB takes value 11 corresponding to k=8.

Gates D 461 and 462, synchronized to the same frequency $f_e/m$ as the CLEAR inputs of the JK gates, to within a slight phase shift, make it possible to store in memory the values of A and B during the m=5 sampling periods corresponding to one block.

FIG. 6 shows the FIFO stack (not shown in FIG. 1) of m=5 registers 36 and 11 bits which delay, during the characteristic selection operation, the m=5 samples which constitute the block.

Generally speaking, it is possible to set up, using a diagram analogous to the one in FIG. 5, a circuit which can select among $2^\alpha$ characteristics, the one which is best for each bloc of samples. Such a circuit will include ($2^\alpha-1$) JK flip-flops generating characteristic bits and $\alpha$ D flip-flops making it possible to store the bits during the selection.

Before describing, in reference to FIG. 6, an embodiment of transcoder 3 of FIG. 1, we shall briefly examine the problem due to decoding making it possible to restore the analog signals at the output from the digital link. The purpose of this decoding, generally speaking, is to reconstitute the value of an analog sample from each word of p bits. To minimize the quantization noise, we shall select this value as being equal to the arithmetic mean of those levels (in the n-bit code) of the p-bit word generated by transcoder 3 and transmitted by multiplexer 5 and converter 6. If the number of levels of the n-bit code which have been grouped into the same level of the p-bit code is odd, the said mean value is one of the levels of the n-bit code. It is not any level of the n-bit code if the number of levels which were regrouped is even. In this case, an additional quantization noise appears whose amplitude varies from 0 to q/2. If the continuous component is excluded, the power of the noise may reach $q^2/16$, which is not negligible in comparison with the quantization noise n $q^2/12$ introduced by the linear coding with n bits.

In fact, three cases may occur.

If the characteristics selected by the characteristic selection circuit are such that the levels of the n-bit code grouped into a p-bit code level are an odd number, an n-bit output can perform the decoding.

If the said characteristics are such that the n-bit levels grouped into a p-bit level are an even number, an n-bit output transcoder may also be used, if a phase shift of a half step is imposed troughout the scale. This shift brings about the appearance of a continuous component of power $q^2/4$ which can easily be filtered at the transcoder output.

Finally, if among the groupings selected, there are some which have an odd number of levels and others which have an even number of levels, it is necessary to use for decoding a transcoder of (n+1) output bits; the number of levels is duplicated and we can, therefore, always have available an intermediate mean level between two consecutive levels of the n-bit code. Nevertheless, it is necessary to impose a shift of plus or minus q/4 throughout the scale of the n-bit code levels. The continuous power component $q^2/16$ caused by this shift may be easily filtered.

The above information is only given to demonstrate that it is always possible to define the digital correspondances which make possible transcoding (at coding and at decoding) with sufficient definition. The use of a transcoder having at least one read-only memory (ROM or PROM for example) makes it possible to obtain any linear or non-linear transcoding characteristic which is desired. According to its most simple set-up, the transcoder for the coding operation essentially comprises a read-only memory having stored therein p-bit words at n+$\alpha$ addresses, and the transcoder for the decoding operations essentielly comprises a read-only memory having stored therein n-bit words at p+$\alpha$ addresses.

Therefore, the memory capacity of the transducer for coding should be $2^n \times$ p-bits for each of the $2^\alpha$ characteristics, that is a total of $2^{n+\alpha} \times$ p bits. As to the memory capacity of the transcoder for decoding, it should be a total of $2^{p+\alpha} \times (n+1)$ bits if this transcoder delivers words of (n+1) bits. These conditions may make it necessary to use very large memories particularly for coding, or to multiply the number of memories to reach the required capacity.

However, the invention provides arrangements to reduce the necessary capacities. First of all, we are going to consider the case of the transcoder for coding.

Considering now FIG. 6, the transcoder for coding which it represents (reference 3 in FIG. 1) has a buffer register 130, "exclusive OR" gates 140 and PROM memories 151, 152 and 153 having three state outputs. It is intended for transcoding sample words from two SMGs delivered by linear coder 2 and to be transmitted at a digital rate of 140 Mbit/s. The values of parameters n, p and $\alpha$ are the same as in the preceding examples, that is: m=11, p=8 and $\alpha$=2.

FIFO stack 36 of 11 bits, has a sign S input directly connected to output S of buffer register 41 (FIG. 5) and (n−1)=10 inputs of absolute value bits $c_1, c_2, \ldots c_{10}$, connected to outputs $b_1, b_2, \ldots b_{10}$ of buffer register 41 via 10 "exclusive OR" gates 140 each having one input connected to one of the said outputs, and the other input to output S of the said register. The three high weight bits $c_1$, $c_2$ and $c_3$ are directly delivered to the three comparators 421, 422 and 423 of the characteristic selection circuit 4 of FIG. 5. FIFO stack 36 transmits the bit of sign S to multiplexer 5 (FIG. 1). The (n−1)=10 bits of output $c_1, c_2, \ldots c_{10}$ to the register 150 are simultaneously delivered to the read address inputs of memories 151, 152 and 153.

This splitting of the memory means into three sub-memories (or more) is for practical reasons. Each of these sub-memories also has, in the known way, four memory selection inputs $\overline{CS1}$, $\overline{CS2}$, CS3 and CS4 (CS = "chip select") which make possible its selection when condiguration 0011 is present at inputs $\overline{CS1}$, $\overline{CS2}$, CS3, CS4 using characteristic selection bits A and B delivered by circuit 4. These selection inputs in fact constitute read addressing inputs. In other words, the overall memory made up of the three sub-memories 151, 152 and 153 stores the words of (p−1)=7 bits which it delivers via outputs $a_1, a_2, \ldots a_7$, and it is addressed on read by an addressing word having two parts, one of which is delivered by linear coder 2 via FIFO stack 36 and the other by characteristic selection circuit 4.

To determine the capacity and the allocation of each of these three sub-memories 151, 152 and 153, it may be noted that, for k=2, bits $c_1$ and $c_2$ remain constantly at zero and that, for k=3 or 4, bit $c_1$ remains constantly at zero. Several combinations are possible depending upon the available memories. In the diagram of FIG. 6, memory 151 is allocated to the words of (p−1) bits corresponding to k=2 or 3 and it is selected by means of the single bit A. We then connect B to input $C_1$ of memory 151 which allows splitting it in two: addresses 0 to 511 corresponding to k=2, and addresses 512 to 1023 corresponding to k=3. Memory 152 and memory 153 respectively store the words of (p−1) bits corresponding to k=4 and to the non-linear characteristic, and are selected using bits A and B. The calculation shows that this combination requires a theoretical overall capacity of 2170×7 bits. So, it is evidently advantageous to use the PROM moemries which are on the market, at 1024×8 bits, leaving one output unused and certain addresses not occupied.

Advantageously, these PROM memories are three state memories, which make it possible to directly connect their $a_1, a_2, \ldots a_7$ outputs in parallel to the corresponding inputs of multiplexer 5 without using the multiplexers of bits which would require using memories with only output terminals with two states.

FIG. 7 represents the transcoder 7 of FIG. 1. This transcoder receives from series-to-parallel converter 6, parallel p-bit words and α bits of characteristic selection. It must supply linear decoder 8 with words of n or (n+1) bits making it possible for this decoder by means of filter 9, to restore an analog value (which we call $/\hat{x}/$, such that:

$$/\hat{x}/ = kp + k/2$$

Decoder 8 produces a signal varying from $-V_{max}$ to $+V_{max}$ in correspondence wirh code words varying from 0 to $2^{n+1}-1$. If we call Q the quantization increment value associated with the coding at (n+1) bit words, that is:

$$Q = V_{max}/2^n$$

we can always, by means of an appropriate shift causing a continuous component which can be filtered, make amplitude +Q/2 correspond to code 10—0 and amplitude −Q/2 to 01—1.

The transcoder for decoding is controlled by p-bit words with p=8 and by the α=2 bits A and B for selection of the characteristic, all delivered by series-to-parallel converter 6 (FIG. 1) and transmits a sample signal of n+1=12 bits, including the sign bit, to linear decoder 8.

Transcoder 7 for decoding comprises a multiplier 71, a multiplier 72 and four memory registers 73 in which are respectively stored the four possible values of characteristic k, that is k=2, 3, 5 and 8.

First of all, we consider the multiplicand inputs of multiplier 71. The sign bit of the sample signal is reversed by inverter 74 before being addressed at input S. The absolute value bits are delivered to inputs $b_4, b_5, \ldots b_{10}$ via "exclusive OR" gates 75. One input of each gate receives the corresponding absolute values bit, and the other input receives the reversed sign bit delivered by inverter 74. The result is that the value S=0 corresponds to a positive sample and that, for a negative sample, all the sample bits are reversed. In other words, multiplier 71 operates on the complement to two. It also has an input $b_{11}$, systematically set at the value 1, which causes adding $\frac{1}{2}$ in absolute value to the multiplicand.

As to the multiplier inputs of multiplier 71, the multiplying coefficient k may adopt four possible values, k=2, 3, 5 and 8, and four bits are enough to express the maximum value k=8.

The multiplier has four inputs and received selectively on these inputs the coefficient k stored in the four registers 73, through multiplexer 72 controlled by characteristic selection bits A and B.

We claim:

1. A transmission system of frequency division multiplex analog signals on a digital link comprising:
   a sampler of said frequency division multiplex signals generating sample signals;
   a linear coding means for coding said sample signals into n-bit sample words;
   means for selecting a plurality of integers k each representing a number of successive levels of a n-bit code to be transcoded into one and the same level of a p-bit code with p smaller than n, said integers being one of the natural numbers between unity and $2^{n-p}$;
   means for forming and selecting transcoding control words of α bits expressing in binary code the integers k selected;
   a first transcoding means for transcoding each n-bit sample word into a p-bit on-line word depending upon the selected transcoding control word, said first transcoding means being formed by a read only memory having said p-bit on-line words stored therein at addresses formed by α set of n-bit sample words, each p-bit word being selectively transcoded from one among α n-bit sample words responsively to the transcoding control word selected;
   multiplexer means receiving the bits of the on-line words and the additional bits of the control words from said first transcoding means and serially sending said on-line and additional bits on said digital link;
   a second transcoding means for transcoding the p-bit on line words into reconstituted n-bit sample words, said second transcoder means being controlled by said additional bits of said control words; and
   a linear decoding means for decoding said reconstituted n-bit sample words.

2. A transmission system of frequency division multiplex analog signals on a digital link comprising:
   a sampler of said frequency division multiplex signals generating sample signals;

a linear coding means for coding said sample signals into n-bit sample words;

means for forming n-bit sample word blocks each containing a given number of successive sample words;

means for comparing the binary value x of each n-bit sample words of the block to $2^\beta$ where $\beta$ is comprised between p included and n included;

means for transcoding the n-bit sample words to a block into p-bit on-line words according to a correspondence table in which $2^{n-p}$ successive levels of the n-bit code are converted to one and the same level of the p-bit code when $$2^{n-1} \leq x < 2^n$$

means for transcoding the n-bit sample words of a block into p-bit on-line words according to a correspondence table in which $2^{n-p-1}$ successive levels of the n-bit code limited to $(2^{n-1}-1)$ are converted to one and the same level of the p-bit code when $$2^{n-2} \leq x < 2^{n-1}$$

means for transcoding the n-bit sample words of a block into p-bit on-line words according to a correspondence table in which 2 successive levels of the n-bit code limited to $(2^{p+1}-1)$ are converted to one and the same level of the p-bit code when $$2^p \leq x < 2^{p+1}$$

means for transcoding the n-bit sample words of a block into p-bit on-line words according to a correspondence table in which each level of the n-bit code limited to $(2^p-1)$ is converted to one and the same level of the p-bit code when $$2 \leq x < 2^p$$

* * * * *